United States Patent [19]
Lee et al.

[11] Patent Number: 5,874,765
[45] Date of Patent: Feb. 23, 1999

[54] SEMICONDUCTOR DEVICE AND METHOD FOR FABRICATING THE SAME

[75] Inventors: Sang Don Lee; Woun S Yang, both of Chungcheongbuk-do, Rep. of Korea

[73] Assignee: LG Semicon Co., Ltd., Chungcheongbuk-Do, Rep. of Korea

[21] Appl. No.: 58,281

[22] Filed: Apr. 10, 1998

[30] Foreign Application Priority Data

Oct. 28, 1997 [KR] Rep. of Korea ............... 1997/55653

[51] Int. Cl.$^6$ ................................ H01L 29/78
[52] U.S. Cl. ............................ 257/410; 257/522
[58] Field of Search .................... 257/410, 522

[56] References Cited

U.S. PATENT DOCUMENTS

| | | | |
|---|---|---|---|
| 5,324,683 | 6/1994 | Fitch et al. | 438/622 |
| 5,736,446 | 4/1998 | Wu | 438/305 |
| 5,770,507 | 6/1998 | Chen et al. | 438/305 |

FOREIGN PATENT DOCUMENTS

| | | | |
|---|---|---|---|
| 63-177469 | 7/1988 | Japan | 257/410 |
| 1-005075 | 1/1989 | Japan | 257/419 |

OTHER PUBLICATIONS

M. Togo et al., "A Gate–side Air–gap Structure (GAS) to Reduce the Parasitic Capacitance in MOSFETs", *1996 Symposium on VLSI Technology, Digest of Technical Papers*, Jun. 1996, pp. 38–39.

*Primary Examiner*—David B. Hardy
*Attorney, Agent, or Firm*—Morgan, Lewis & Bockius LLP

[57] ABSTRACT

An MOSFET (metal oxide semiconductor field effect transistor) and a method for fabricating the same in which charge trap is prevented at sidewall spacer of a gate insulating film are disclosed, the MOSFET including a gate insulating film and a gate electrode successively formed on a semiconductor substrate of first conductivity type; an insulating sidewall spacer formed on sides of the gate electrode; a vacuum region formed between the semiconductor substrate and the insulating sidewall spacer; and source/drain regions formed beneath surface of the semiconductor substrate at side of the gate electrode.

8 Claims, 9 Drawing Sheets

SEMICONDUCTOR DEVICE AND METHOD FOR FABRICATING THE SAME

BACKGROUND OF THE INVENTION

1. Field of the Invention

The present invention relates to a semiconductor device and a method for fabricating the same and, more particularly, to an MOSFET (metal oxide semiconductor field effect transistor) and a method for fabricating the same in which charge trap is prevented at sidewall spacer of a gate insulating film.

2. Discussion of the Related Art

It is constructed in a general MOS (metal oxide semiconductor) device that a oxide ($SiO_2$) film is formed on the surface of semiconductor (silicon) and metal is formed thereon. In an FET (field effect transistor), a gate insulating film made of oxide and a gate electrode are successively formed on a silicon substrate of first conductivity type, and source and drain regions are formed beneath the surface of the silicon substrate.

An MOSFET serves to control current (channel current) flowing between source and drain by potential of a gate electrode.

A background MOSFET will be described with reference to the accompanying drawings.

Figure 1:
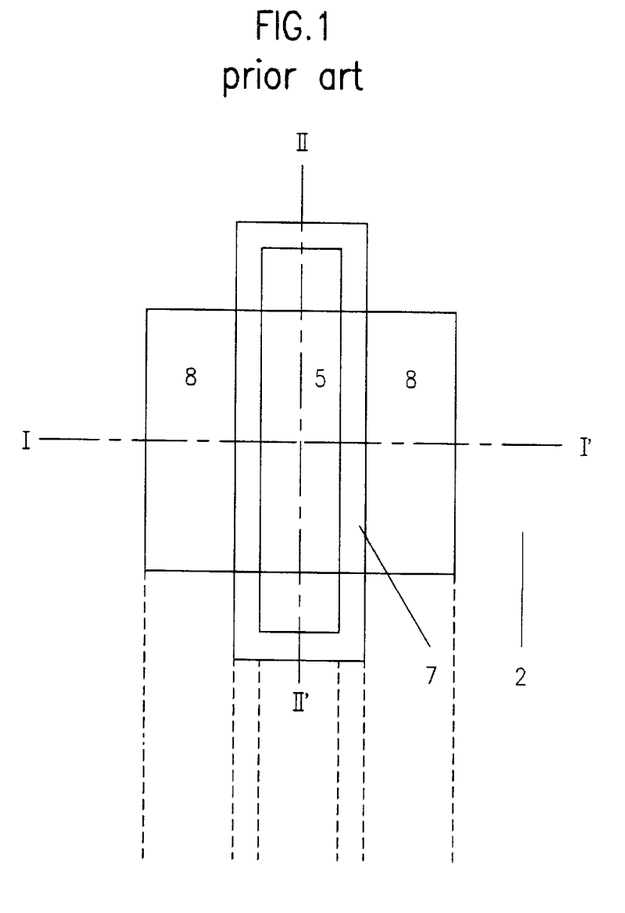
FIG. 1 is a plan view showing a structure of a background MOSFET.
Figure 2:
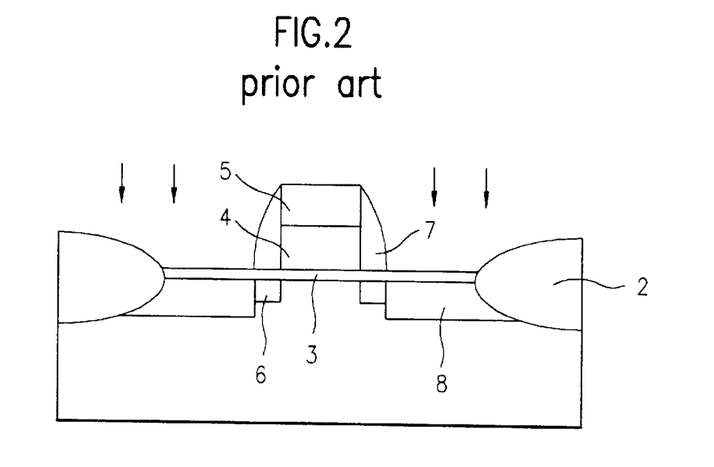
FIG. 2 is a cross-sectional view showing a structure of the MOSFET, taken along line I–I' of FIG. 1.
Figure 3:
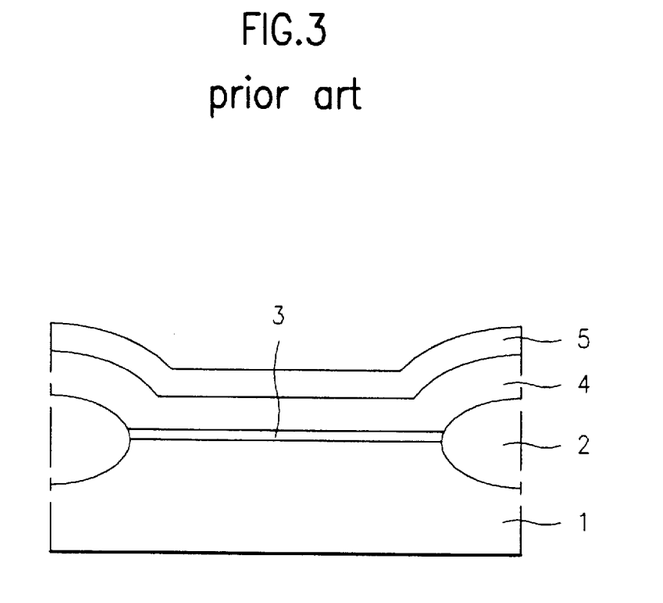
FIG. 3 is a cross-sectional view showing a structure of the MOSFET, taken along line II–II' of FIG. 1.

FIG. 1 is a plan view of a background MOSFET, FIG. 2 is a cross-sectional view showing a structure of the MOSFET taken along line I–I' of FIG. 1, FIG. 3 is a cross-sectional view showing a structure of a the MOSFET taken along line II–II', and FIGS. 4A to 4D are cross-sectional views showing process steps of a method for fabricating the MOSFET taken along line I–I'.

In an n channel MOSFET, a field oxide film 2 is formed on a p type semiconductor substrate 1 of a field region. A gate insulating film 3, a gate electrode 5, and a cap gate insulating film 5 are formed on the substrate 1 of an active region. A sidewall spacer 7 is formed on sides of the gate insulating film 3, the gate electrode 4, and the cap gate insulating film. n type lightly doped impurity regions 6 are formed beneath the surface of the semiconductor substrate 1 beneath the sidewall spacer 7. n type heavily doped impurity regions 8, which are used as source and drain regions, are formed at side of the sidewall spacer 7.

A method for fabricating a background n channel MOSFET having the aforementioned structure will be described with reference to the accompanying drawings.

Figure 4A:
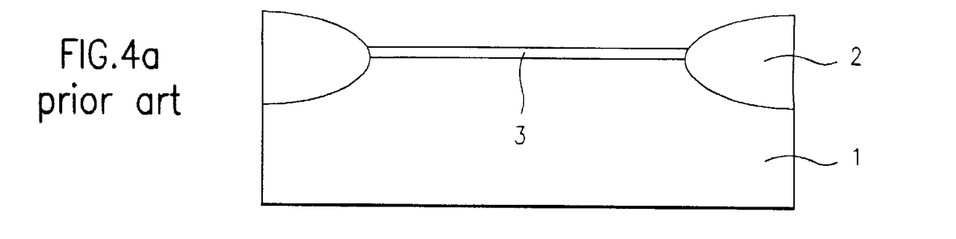
FIGS. 4A to 4D are cross-sectional views showing process steps of a background method for fabricating the MOSFET, taken along line I–I' of FIG. 1.

Referring initially to FIG. 4A, a field oxide film 2 is formed on a p type semiconductor substrate 1 of a field region. A gate insulating film 3, made of an oxide film, is formed on the substrate 1 of an active region.

Figure 4B:
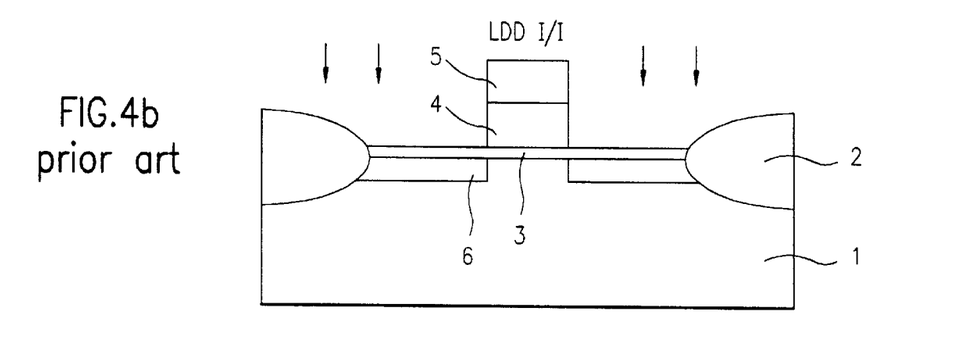

Referring to FIG. 4B, a gate electrode 4 and a cap gate insulating film 5 are formed on a predetermined area of the gate insulating film 3. With the gate electrode 4 and the cap gate insulating film 5 serving as masks, n type impurity ions are lightly implanted.

Figure 4C:
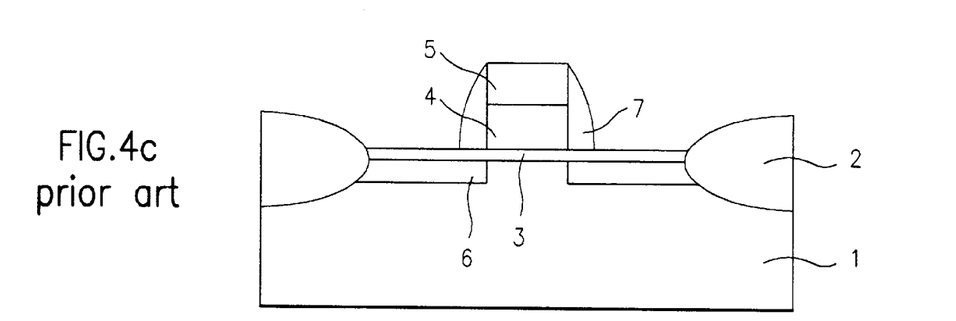

Referring to FIG. 4C, an insulating film is deposited on the entire surface and then anisotropically etched, thus forming an insulating sidewall spacer 7 on the sides of the gate electrode 4 and the cap gate insulating film 5.

Figure 4D:
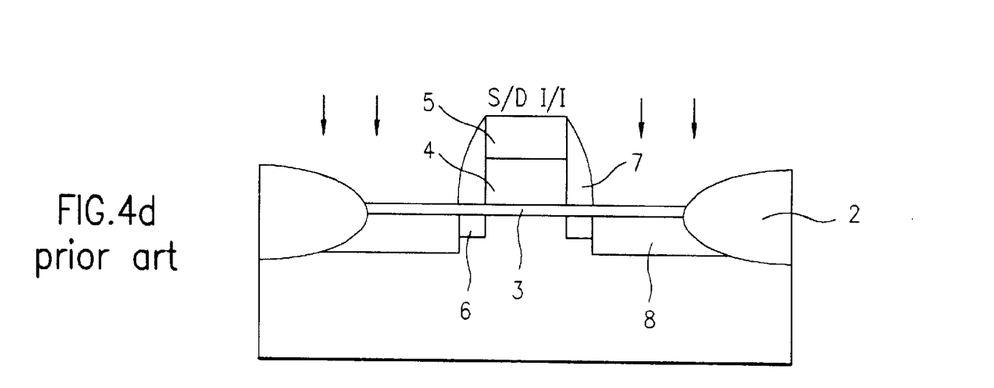

Referring to FIG. 4D, n type impurity ions are heavily implanted with the cap gate insulating film 5 and the insulating sidewall spacer 7 serving as masks, so that n type impurity regions 8, which are source/drain regions, are formed beneath the surface of the semiconductor substrate 1 at the side of the insulating sidewall spacer 7.

The operations of such a background MOSFET will be described below.

A background MOSFET is an LDD MOSFET in which a gate insulating film 3 is formed between a semiconductor substrate 1 and a gate electrode 4 and an insulating sidewall spacer 7 and source/drain regions include lightly doped impurity regions 6 and heavily doped impurity regions 8. Thus, if a voltage of bigger than a threshold voltage is applied to the gate electrode 4, a channel is formed at the semiconductor substrate under the gate electrode 4 so that current flows between source and drain.

In this LDD MOSFET, drain electric field at edge of the gate electrode can be decreased by the resistance of lightly doped impurity regions in comparison with an SD (single drain) structure. Thus, the device performance declined due to hot carrier can be improved.

The background MOSFET has the following problems. Since an oxide film is formed between a substrate and an insulating sidewall spacer, charge trap is generated at the interface of the insulating sidewall spacer and the oxide film and in the oxide film so that the device performance becomes deteriorated.

SUMMARY OF THE INVENTION

Therefore, the present invention is directed to a semiconductor device and a method for fabricating the same that substantially obviates one or more of problems due to limitations and disadvantages of the related art.

An object of the invention is to provide an MOSFET and a method for fabricating the same in which prevented is charge trap generated at a gate insulating film on the side of a gate so as to improve the device performance.

Additional features and advantages of the invention will be set forth in the description which follows and in part will be apparent from the description, or may be learned by practice of the invention. The objectives and other advantages of the invention will be realized and attained by the structure particularly pointed out in the written description and claims hereof as well as the appended drawings.

To achieve these and other advantages and in accordance with the purpose of the present invention, as embodied and broadly described, the semiconductor device includes a gate insulating film and a gate electrode successively formed on a semiconductor substrate of first conductivity type; an insulating sidewall spacer formed on sides of the gate electrode; a vacuum region formed between the semiconductor substrate and the insulating sidewall spacer; and source/drain regions formed beneath surface of the semiconductor substrate at side of the gate electrode.

In another aspect of the present invention, a method for fabricating a semiconductor device includes the steps of forming a gate insulating film on a semiconductor substrate of first conductivity type; forming a gate electrode on the gate insulating film; forming an insulating sidewall spacer on side of the gate electrode; selectively removing the exposed gate insulating film and the gate insulating film under the insulating sidewall spacer; and forming an insulating film on the entire surface of the semiconductor substrate including the gate electrode so that a portion where the gate insulating film under the insulating sidewall spacer is removed becomes vacuum.

It is to be understood that both the foregoing general description and the following detailed description are exemplary and explanatory and are intended to provide further explanation of the invention as claimed.

BRIEF DESCRIPTION OF THE DRAWINGS

These and various other objects, features, and advantages of the present invention will be readily understood with reference to the following detailed description read in conjunction with the accompanying drawings, in which.

DETAILED DESCRIPTION OF THE PREFERRED EMBODIMENTS

Reference will now be made in detail to the preferred embodiments of the present invention, examples of which are illustrated in the accompanying drawings.

Figure 5:
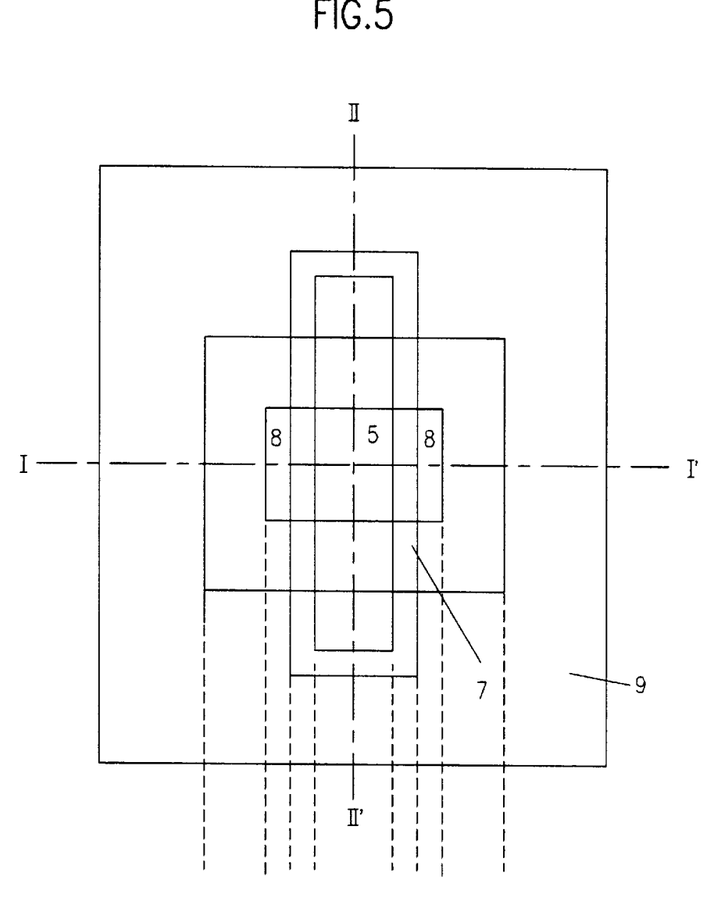
FIG. 5 is a plan view showing a structure of an MOSFET according to a first embodiment of the present invention.
Figure 6:
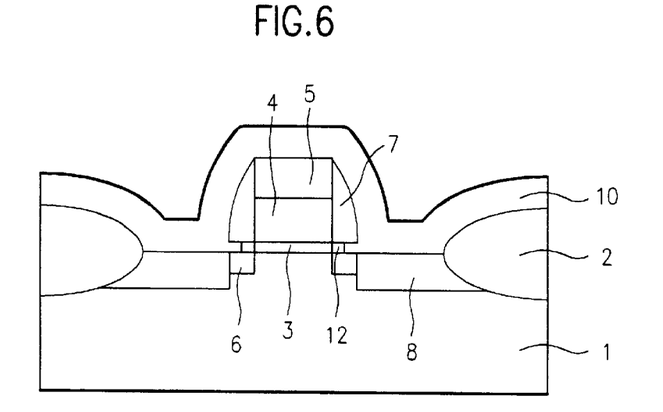
FIG. 6 is a cross-sectional view showing a structure of the MOSFET, taken along line I–I' of FIG. 5.
Figure 7:
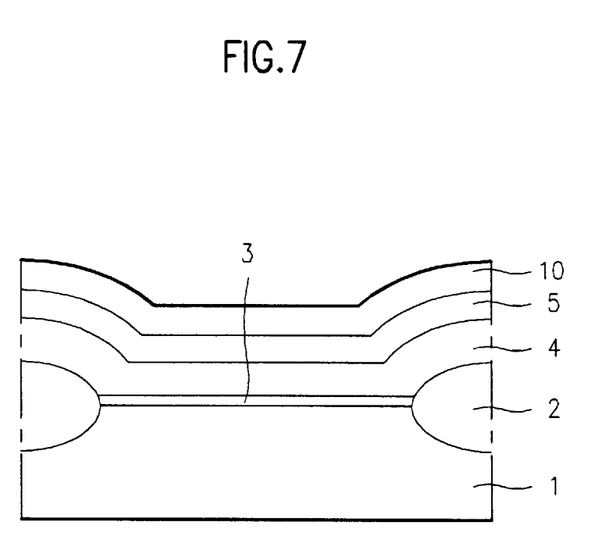
FIG. 7 is a cross-sectional view showing a structure of the MOSFET, taken along line II–II' of FIG. 5.

FIG. 5 is a plan view showing a structure of an MOSFET according to the first embodiment of the present invention, FIG. 6 is a cross-sectional view showing a structure of the MOSFET, taken along line I–I' of FIG. 5, FIG. 7 is a cross-sectional view showing a structure of the MOSFET, taken along line II–II' of FIG. 5, and FIGS. 8A to 8D are cross-sectional views showing process steps of a method for fabricating the MOSFET, taken along line I–I' of FIG. 5 according to the first embodiment of the present invention.

In the structure of an MOSFET according to the first embodiment, a p type semiconductor substrate 1 is defined as active and field regions. While a field oxide film 2 is formed on the semiconductor substrate 1 of the field region, a gate insulating film 3, a gate electrode 4, and a cap gate insulating film 5 are successively formed on a predetermined area of the semiconductor substrate 1 of the active region. A sidewall spacer 7 is formed on sides of the gate electrode 4 and the cap gate insulating film 5. A vacuum region 12 is generated between the substrate 1 and the insulating sidewall spacer 7. At this time, the gate insulating film 3 is formed of an oxide film and the insulating sidewall spacer 7 is formed of a nitride film which has an etch rate different from that of the oxide film.

n type lightly doped impurity regions 6 are formed beneath the surface of the semiconductor substrate 1 under the insulating sidewall spacer 7. n type heavily impurity regions 8 are formed beneath the surface of the semiconductor substrate 1 at the side of the insulating sidewall spacer 7. An insulating film 10 is formed on the surfaces of the cap gate insulating film 5, the insulating sidewall spacer 7, the n type heavily doped impurity regions 8, and the field oxide film 2. A vacuum region is formed between the insulating sidewall spacer 7 and the semiconductor substrate 1.

A method for fabricating an MOSFET having the aforementioned structure will be described with reference to the accompanying drawings.

Figure 8A:
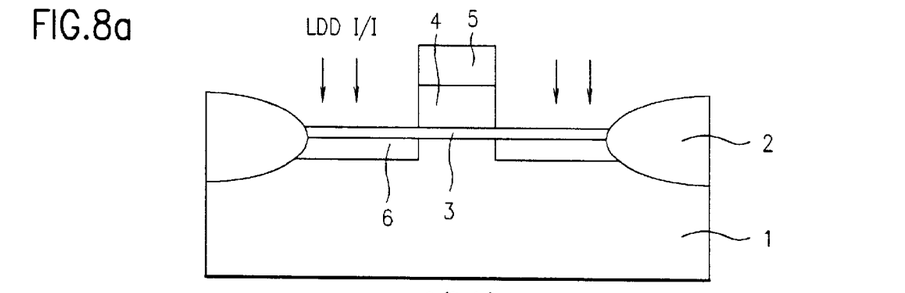
FIGS. 8A to 8D are cross-sectional views showing process steps of a method for fabricating the MOSFET, taken along line I–I' of FIG. 5 according to the first embodiment of the present invention.

Referring initially to FIG. 8A, while a field oxide film 2 is formed on a p type semiconductor substrate 1 of a field region, a gate insulating film 3 is formed on the substrate 1 of an active region. A gate electrode 4 and a cap gate insulating film 5 are successively formed on a predetermined area of the insulating film 3. At this time, they are made of an oxide.

With the gate electrode 4 and the cap gate insulating film 5 serving as masks, n type impurity ions are lightly implanted into the semiconductor substrate 1, thereby forming n type lightly doped impurity regions 6.

Figure 8B:
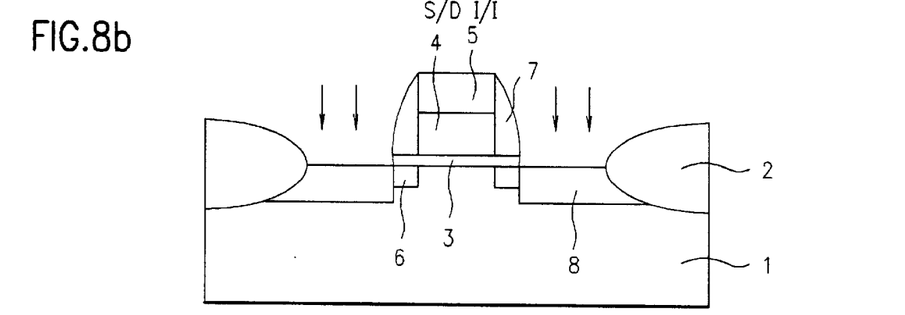

Referring to FIG. 8B, an insulating film made of e.g. an nitride is deposited on the entire surface and anisotropically etched to form a gate electrode 4, a cap gate insulating film 5, and an insulating sidewall spacer 7. At this time, with the insulating sidewall spacer 7 serving as a mask, the exposed gate insulating film 3 is removed.

With the insulating sidewall spacer 7 and the cap gate insulating film 5 serving as masks, n type impurity ions are heavily doped, thereby forming n type heavily doped impurity regions 8 which are source and drain regions beneath the surface of the semiconductor substrate 1 at the side of the insulating sidewall spacer 7.

Figure 8C:
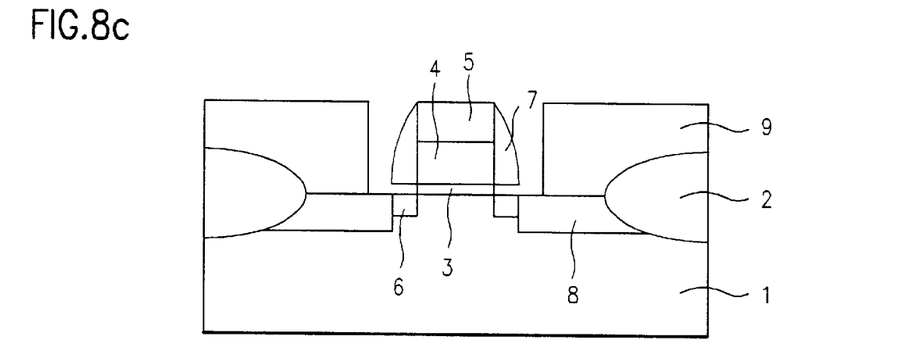

Referring to FIG. 8C, a photoresist film 9 is coated on the whole surface and patterned so that the cap gate insulating film 5, the insulating sidewall spacer 7, and the n type heavily doped impurity regions 8 adjacent to the sidewall spacer 7 are exposed. The gate insulating film 3 under the insulating sidewall spacer 7 is partially removed with a wet-etch process.

Figure 8D:
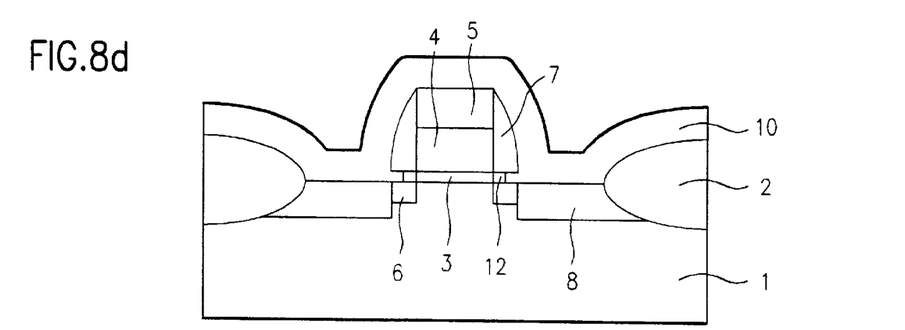

Referring to FIG. 8D, the photoresist film 9 is all removed. An insulating film 10 is formed on the entire surface of the substrate 1 including the cap gate insulating film 5 and the insulating sidewall spacer 7. A vacuum region is formed between the sidewall spacer 7 and the substrate 1.

A semiconductor device and a method for fabricating the same according to the second embodiment will be described with reference to the accompanying drawings.

Figure 9:
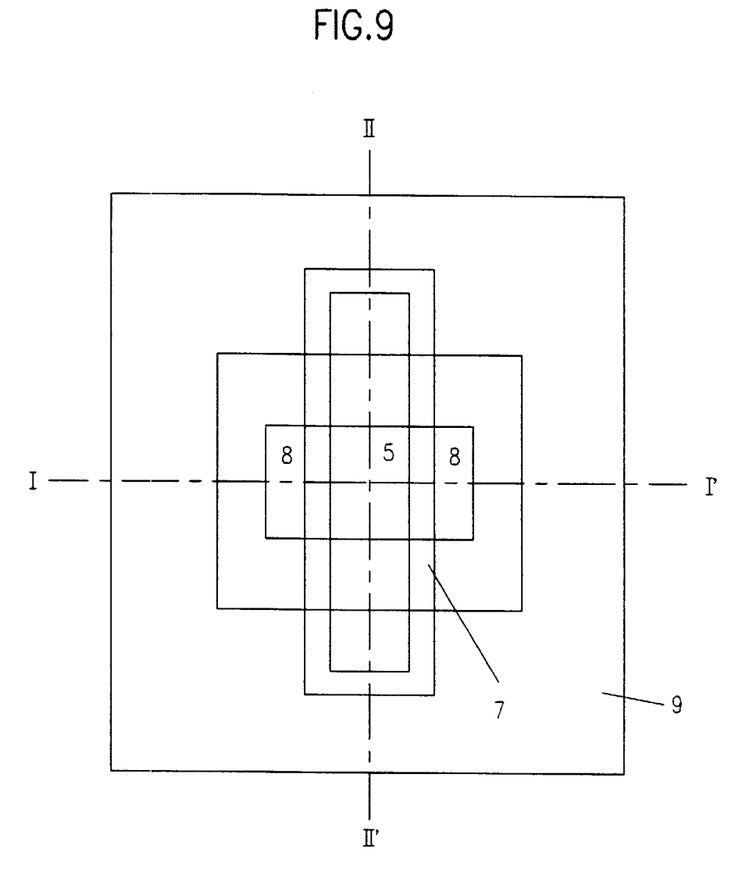
FIG. 9 is a plan view showing a structure of an MOSFET according to a second embodiment of the present invention.
Figure 10:
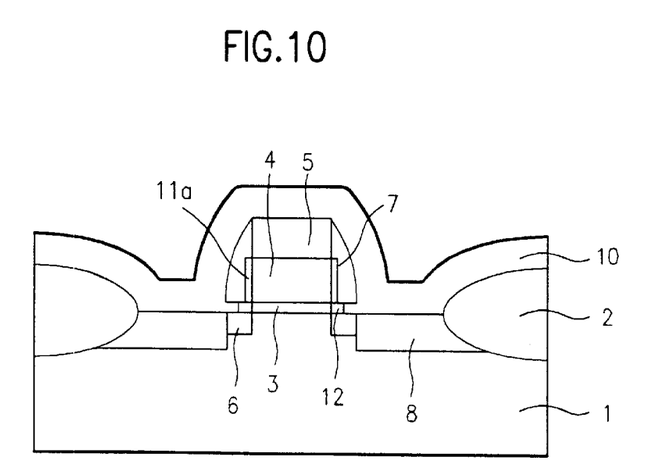
FIG. 10 is a cross-sectional view showing a structure of the MOSFET, taken along line I–I' of FIG. 9.
Figure 11:
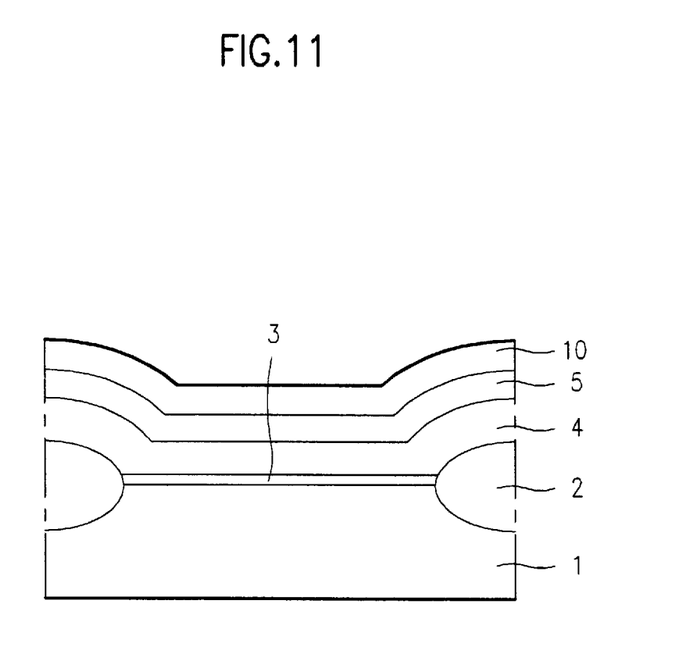
FIG. 11 is a cross-sectional view showing a structure of the MOSFET, taken along line II–II' of FIG. 9.

FIG. 9 is a plan view showing a structure of an MOSFET according to the second embodiment of the present invention, FIG. 10 is a cross-sectional view showing a structure of the MOSFET, taken along line I–I' of FIG. 9, FIG. 11 is a cross-sectional view showing a structure of the MOSFET, taken along line II–II' of FIG. 9, and FIGS. 12A to 12D are cross-sectional views showing process steps of a method for fabricating the MOSFET, taken along line I–I' of FIG. 9.

According to the second embodiment, another insulating sidewall spacer 11a is formed between the gate electrode 4 and the insulating sidewall spacer 7 in comparison with the first embodiment.

A field oxide film 2 is formed on a p type semiconductor substrate 1 of a field region. A gate insulating film 3, a gate electrode 4, and a cap gate insulating film 5 are successively formed on a predetermined area of the semiconductor substrate 1 of an active region. The gate insulating film 3 and the cap gate insulating film 5 are oxide films.

First insulating sidewall spacer 7 is formed on sides of the gate electrode 4 and the cap gate insulating film 5. A second insulating sidewall spacer 11a is formed between the gate electrode 4 and the first insulating sidewall spacer 7. Formed is a predetermined vacuum region between the semiconductor substrate 1 and the first and second insulating sidewall spacers 7 and 11a.

n type lightly doped impurity regions 6 are formed beneath the surface of the semiconductor substrate 1 under the first insulating sidewall spacer 7. n type heavily doped impurity regions 8 as source and drain regions are formed beneath the surface of the semiconductor substrate 1 at the side of the first insulating sidewall spacer 7.

An insulating film 10 is formed on the surfaces of the cap gate insulating film 5, the first insulating sidewall spacer 7, the n type heavily doped impurity regions 8, and the field oxide film 2. At this time, a vacuum region is formed between the semiconductor substrate 1 and the first and second insulating sidewall spacers 7 and 11a by means of the insulating film 10.

A method for fabricating a semiconductor device having the aforementioned structure will be described.

Figure 12A:
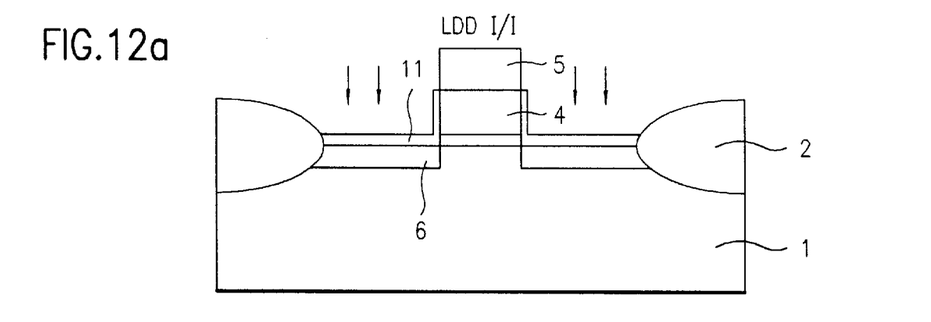
FIGS. 12A to 12D are cross-sectional views showing process steps of a method for fabricating the MOSFET, taken along line I–I' of FIG. 9 according to the second embodiment of the present invention.

Referring initially to FIG. 12A, a field oxide film 2 is formed on a p type semiconductor substrate 1 of a field region. A gate insulating film 3, a gate electrode 4, and a cap gate insulating film 5 are successively formed on a predetermined area of the semiconductor substrate 1 of an active region. A first insulating film 11 such as a thin oxide film is formed on the surface of the exposed semiconductor substrate 1 and the side of the gate electrode 4. At this time, thermal oxidation process is performed to form the first insulating film 11. With the gate electrode 4 and the cap gate insulating film 5 serving as masks, n type impurity ions are lightly implanted to form n type lightly doped impurity regions 6.

Figure 12B:
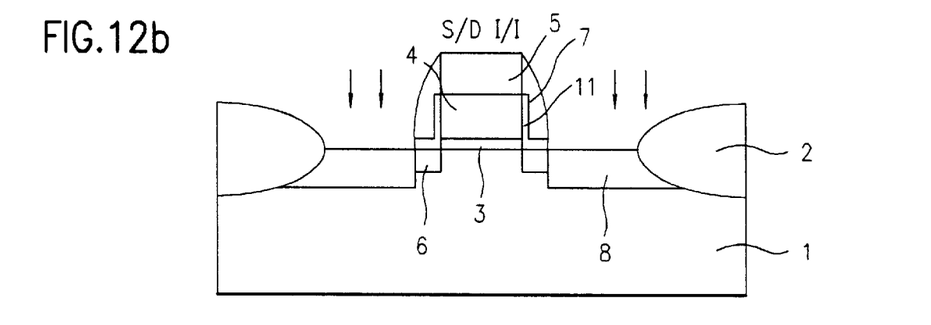

Referring to FIG. 12B, an insulating film is deposited on the whole surface and anisotropically etched to form first insulating sidewall spacer 7 on sides of the first insulating film 11 and the cap gate insulating film 5. The first insulating sidewall spacer 7 is formed of a nitride to use the cap gate insulating film 11 and the cap gate insulating film 5 as etch stopper. The first insulating film 11 is selectively removed with the insulating sidewall spacer 7 as a mask.

With the first insulating sidewall spacer 7 and the cap gate insulating film 5 serving as masks, n type impurity ions are heavily implanted to form n type heavily doped impurity regions 8 beneath the surface of the semiconductor substrate 1 at the side of the insulating sidewall spacer 7. These impurity regions 8 are used as source and drain regions.

Figure 12C:
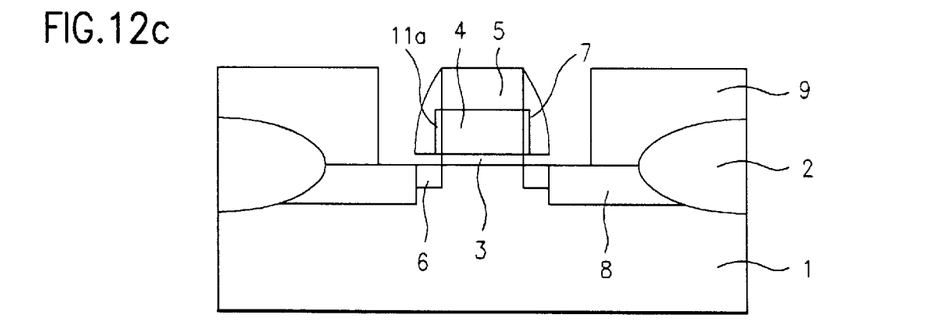

Referring to FIG. 12C, a photoresist film 9 is coated on the whole surface and patterned to expose the cap gate insulating film 5, the gate electrode 4, the first insulating sidewall spacer 7, and the n type heavily doped impurity regions 8. The first insulating film 11 is selectively removed under the first insulating sidewall spacer 7 to form second insulating sidewall spacer 11a between the first insulating film 7 and the gate electrode 4. At this time, the photoresist film 9 is patterned that the center part of the active region is exposed.

Figure 12D:
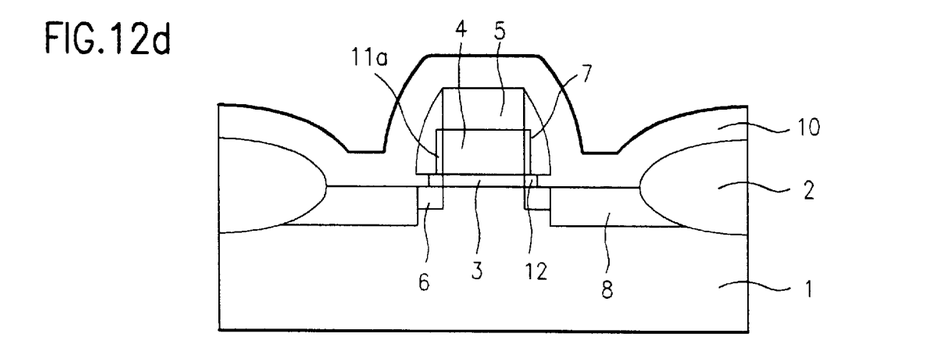

Referring to FIG. 12D, the photoresist film 9 is all removed. A second insulating film 10 is formed on the whole surface of the substrate including the first insulating sidewall spacer 7. At this time, a vacuum area is formed between the semiconductor substrate 1 and the first insulating sidewall spacer 7.

Such an MOSFET and a method for fabricating the same have the following advantages. Since a vacuum area is formed between a semiconductor substrate and an insulating sidewall spacer, electric trap is not generated even though hot carrier is generated at drain electric field. The device performances are improved.

It will be apparent to those skilled in the art that various modification and variations can be made in the semiconductor device and the method for fabricating the same of the present invention without departing from the spirit or scope of the inventions. Thus, it is intended that the present invention cover the modifications and variations of this invention provided they come within the scope of the appended claims and their equivalents.

What is claimed is:

1. A semiconductor device comprising:
   a gate insulating film and a gate electrode successively formed on a semiconductor substrate of first conductivity type;
   an insulating sidewall spacer formed on sides of the gate electrode;
   a vacuum region formed between the semiconductor substrate and the insulating sidewall spacer; and
   source/drain regions formed beneath surface of the semiconductor substrate at side of the gate electrode.

2. A semiconductor device comprising:
   a semiconductor substrate of first conductivity type defined as field and active regions;
   a field oxide film formed on the semiconductor substrate of the field region;
   a gate insulating film, a gate electrode, and a cap gate insulating film successively formed on the semiconductor substrate of the active region;
   a first insulating sidewall spacer formed on sides of the gate electrode and the cap gate insulating film;
   a vacuum region formed between the first insulating sidewall spacer and the semiconductor substrate;
   lightly doped impurity regions of second conductivity type formed beneath surface of the semiconductor substrate under the first insulating sidewall spacer; and
   heavily doped impurity regions of second conductivity type formed beneath the surface of the semiconductor substrate at side of the first insulating sidewall spacer.

3. The semiconductor device as claimed in claim 2, further comprising:
   an insulating film formed on the whole surface of the substrate including the cap gate insulating film and the insulating sidewall spacer.

4. The semiconductor device as claimed in claim 2, wherein the gate insulating film and the insulating sidewall spacer are made of different insulating materials having different etch rates.

5. The semiconductor device as claimed in claim 4, wherein the gate insulating film and the insulating sidewall spacer are an oxide film and a nitride film, respectively.

6. The semiconductor device as claimed in claim 2, further comprising:
   a second insulating sidewall spacer formed between the gate electrode and the first insulating sidewall spacer.

7. The semiconductor device as claimed in claim 6, wherein the first and second insulating sidewall spacers are formed of different insulating materials having different etch rates.

8. The semiconductor device as claimed in claim 7, wherein the first and second insulating sidewall spacers are an nitride film and an oxide film, respectively.

* * * * *